(12) United States Patent
Maronchuk et al.

(10) Patent No.: US 7,422,632 B2
(45) Date of Patent: Sep. 9, 2008

(54) EPITAXIAL GROWTH OF STRUCTURES WITH NANO-DIMENSIONAL FEATURES FROM LIQUID PHASE BY PULSE COOLING OF SUBSTRATE

(76) Inventors: Ihor Evgenievich Maronchuk, 24B Berislavskoe shosse Unit 19, Kherson (UA) 73008; Tamara Fatyhovna Kulyutkina, 24B Berislavskoe shosse Unit 19, Kherson (UA) 73008; Aleksander Igorevich Maronchuk, Dnepropetrovskaya str 112A, Kherson (UA) 73002; Maria Vladimirovna Naidenkova, 2255 W. Germann Rd. Unit 2137, Chandler, AZ (US) 85248

(*) Notice: Subject to any disclaimer, the term of this patent is extended or adjusted under 35 U.S.C. 154(b) by 0 days.

(21) Appl. No.: 11/449,385

(22) Filed: Jun. 7, 2006

(65) Prior Publication Data

US 2007/0089668 A1    Apr. 26, 2007

Related U.S. Application Data

(60) Provisional application No. 60/688,769, filed on Jun. 8, 2005.

(51) Int. Cl.
*C30B 19/02* (2006.01)
(52) U.S. Cl. ............................ 117/54; 117/24; 117/45
(58) Field of Classification Search ................ 117/45, 117/24, 54
See application file for complete search history.

(56) References Cited

U.S. PATENT DOCUMENTS

| | | | | |
|---|---|---|---|---|
| 5,705,224 A | * | 1/1998 | Murota et al. | 427/248.1 |
| 2007/0089668 A1 | * | 4/2007 | Maronchuk et al. | 117/54 |

* cited by examiner

*Primary Examiner*—Felisa C Hiteshew

(57) ABSTRACT

The features with size at least in one direction 1 µm growth method was developed by modifying liquid phase epitaxy. Number of processes was developed where duration and amplitude of the cooling pulse at the substrate interface were chosen in order to form low-dimensional features before system return to the equilibrium condition. This method allows obtaining low-dimensional features with observed quantum effect such as quantum layers, dots and superlattices. The shape of the features strongly depends on substrate orientation, stress and growth conditions.

6 Claims, 4 Drawing Sheets

Cassette scheme

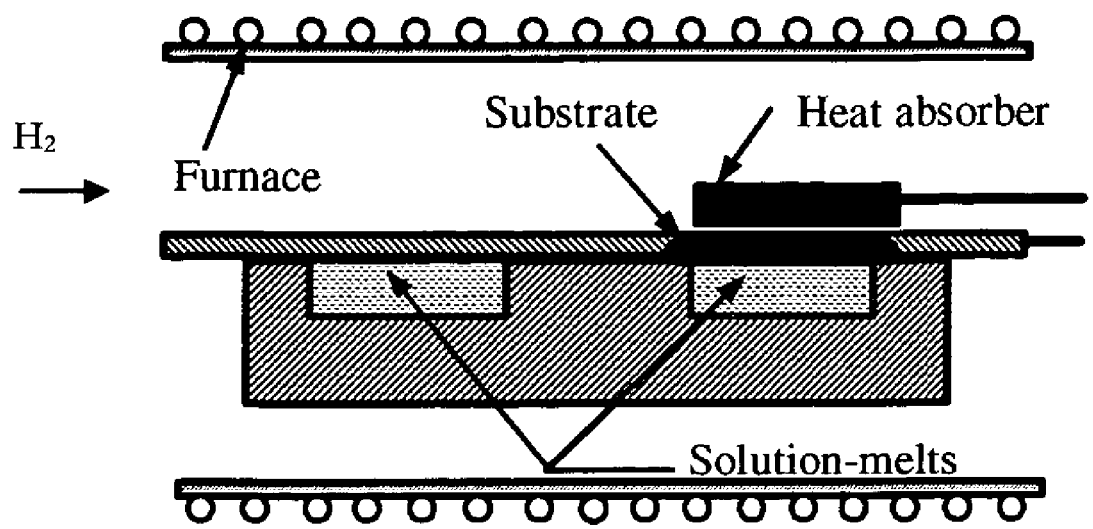
Figure 1. Cassette scheme

Figure 2. STM images of uncovered islands (158x180 nm)

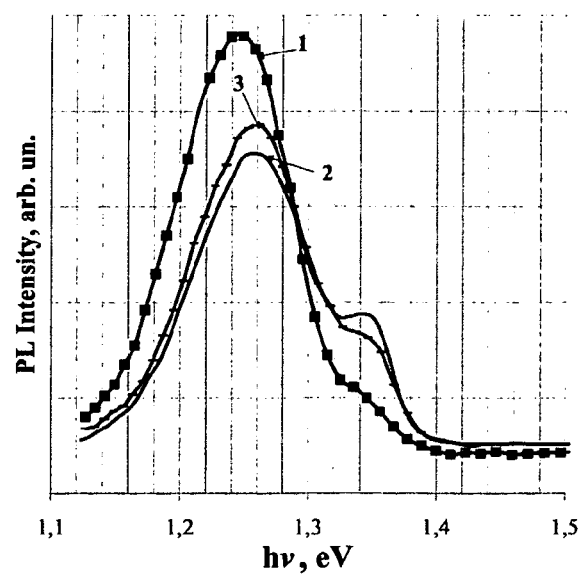
Figure 3. PL spectra of the structure containing islands arrays: 1 – semiconductor laser (1:1); 2 – helium-neon laser (1:10); 3 – argon laser (1:10)

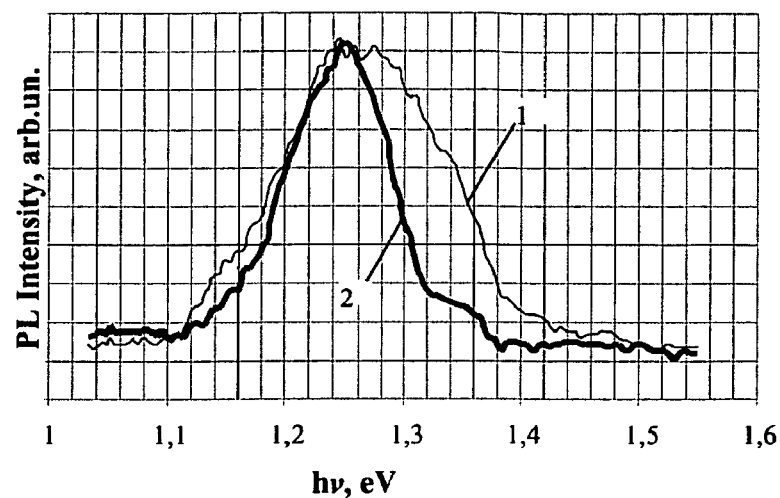
Figure 4. PL spectra of samples grown on GaAs substrate: 1 – cut 4 degrees off in [110] direction; 2 – (100) oriented

EPITAXIAL GROWTH OF STRUCTURES WITH NANO-DIMENSIONAL FEATURES FROM LIQUID PHASE BY PULSE COOLING OF SUBSTRATE

CROSS REFERENCE TO RELATED APPLICATIONS

The present application is related to provisional patent application No. 60/688,769, filed Jun. 8, 2005 entitled "Obtaining heterostructures with quantum dots by liquid-phase epitaxy for solar cells", the details of which are hereby incorporated by reference, and the benefit of the earlier Jun. 8, 2005 filing date is claimed in accordance with 35 USC 119(e)(1).

DESCRIPTION

1. Field of the Invention

The present invention relates to a nanotechnology, pulse cooling of substrate (PCS) method enabling formation of III-V compound semiconductor low-dimensional slab and column-like features and also to a method of fabrication of variety of commercially viable optoelectronic and photonic devices based on III-V column materials structures.

2. Description of the Related Art

The method of liquid phase epitaxy (LPE) was developed at 1960 and had been a dominant method for production of semiconductor structures for lasers, power diodes, and photovoltaic devices. LPE had been used for the mass production worldwide until advent of generation of novel semiconductor devices demanding method of growing deep submicron structures with superior control over chemical composition, uniformity and growth rates.

Nowadays, major methods of [nano] low-dimensional embedded in semiconductor structures growth are Molecular Beam Epitaxy (MBE) and Metal Organic Chemical Vapor Deposition (MOCVD). These methods allow growing low dimensional features [with size less than 0.1 μm] with high degree of control of chemical composition and growth rates. High cost of technological equipment, specific defects in the structures manufactured by MBE and MOCVD technologies stimulate searching of alternative methods of their fabrication, particularly based on crystallization from a liquid phase.

SUMMARY OF THE INVENTION

The invention is essentially a method for growth of features with size at least in one direction less than 1 μm, for example nano-dimensional layers; two dimensional (2D), and three dimensional (3D) island matrix. Compared to MBE and MOCVD methods, PCS method allow obtaining higher density of islands ($\sim 10^{12}$ cm$^{-2}$), lower defect density and higher growth rates.

Epitaxial growth of nano dimensional features was realized from III-V and IV column materials low-melting temperature solution-melts in slider-type cassette placed in quartz reactor in the atmosphere of pure hydrogen (FIG. 1).

In one of the embodiments of the present invention using resistive heater, temperature $T_1$ in the reactor was maintained within the range of 300-500° C. during growth process. The on-axis as well as off-axis cut GaAs substrates were used for structures with 2D nano-dimensional island matrix growth.

The main steps of epitaxial growth method of the present invention are as follows:
a) solution-melt and substrate are heated up to the saturation temperature of solution-melt $T_1$;
b) the working (growth) surface of the substrate is brought into contact with the solution-melt;
c) back surface of the substrate is brought into contact with the heat-absorber (the temperature $T_p$ of which is lower than that of the substrate and solution-melt $\Delta T = T_1 - T_p$) that creates the pulse cooling in the range of 0.5-15° C., the duration of the interval is $5 \times 10^{-2} - 5$ s and the speed of growing the fore front of the cooling pulse is in the range of $5 \times 10^3 - 0.5 \times 10^3$ ° C./s;

The heat-absorber temperature had been chosen so that an overcooling at crystallization front did not exceeded 5-9° C. to avoid homogeneous nucleation in liquid phase volume. After some time τ the heat-absorber was heated to the temperature $T_1$, but during this time there was a cooling at the interface of the substrate and solution-melt, that resulted in crystallization of a dissolved in solution-melt material. The shape of the formed features in particular, low-dimensional layers, 2D and 3D island matrix depends on several factors, for example, stress between substrate and growing feature's material, substrate orientation, and concentration of the material in the solution-melt.

EXAMPLE 1

The Structure with Nano-Dimensional 2D Island Matrix

The Scanning Tunnel Microscopy (STM) images of InAs uncapped islands grown on (100) GaAs substrate at $T_1 = 400$° C., $\Delta T = 5$° C. and heat-absorber thickness $\delta = 0.3$ cm from In solution-melt is presented in FIG. 2. The observed surface density of islands is $\sim 10^{12}$ cm$^{-2}$.

The photoluminescence (PL) spectra of this sample at 77K demonstrate variation in peak position in the 1.24<hv<1.26 eV range, FIG. 3. Photons with energy of 1.25 eV correspond to photoluminescence from 7.8 nm InAs islands in GaAs. Seven times PL intensity increase is observed when excitation power increases from 5 mW to 20 mW. Further excitation power increase up to 2 W does not significantly effect PL peak position as well as intensity that prove presence of the quantum dots. The PL peak position measured at different spots on the sample was in the 10 meV range what correspond island size variation around 10%.

EXAMPLE 2

The structure with two populations of nano-dimensional islands grown simultaneously during one cooling pulse FIG. 4 presents photoluminescence spectra of two samples. Sample 1 (curve 1) has been grown on (100) GaAs substrate cut 4 degrees off in [110] direction; Sample 2 (curve 2) has been grown on (100) on-axis substrate. Coincidence of long wavelength part of PL spectrum of the samples demonstrates that size distribution of "large" islands is identical for these two samples. At the same time PL spectrum of misoriented sample reveals island size distribution broadened towards smaller sizes featuring split peak. In this case misoriented substrate provided growth front consisting of two steps with different nucleation conditions that resulted in two "independent" populations of InAs islands. Resulting PL spectrum is a superposition of PL from this two populations of InAs islands each having its own Gaussian-like size distribution. The structures containing nano-dimensional islands grown on misoriented substrates can be utilized in photovoltaic devices or diodes due to wider range light absorption or emission; or achieving several specific wavelength light absorption or emission.

Additional advantages and features of the present invention are described in the following Appendix A, entitled "OBTAINING HETEROSTRUCTURES WITH QUANTOM DOTS BY LIQUID-PHASE EPITAXY FOR SOLAR CELLS", published August, 2004 (World Renewable Energy Congress), the details of which are hereby incorporated by reference.

What is claimed is:

1. A modification of a Liquid Phase Epitaxy method comprising the following sequence of steps:
   providing a substrate, a solution-melt, and a heat-absorber, wherein the substrate comprises a working surface and a back surface, the solution-melt comprises a saturation temperature, and the heat absorber comprises a temperature;
   heating the solution-melt and the substrate to the saturation temperature;
   arranging contact between the substrate working surface and the solution-melt;
   arranging contact between the substrate back surface and the heat-absorber, wherein the temperature of the heat absorber is up to 15° C. lower than temperature of the substrate and solution-melt, and wherein said contact creates a pulse cooling;
   carrying out epitaxial growth on the substrate working surface; and
   terminating the contact between the substrate working surface and the solution-melt.

2. The method of claim 1, wherein said step of heating the substrate to the saturation temperature is omitted and with the additional step of cooling the substrate by arranging contact between the substrate back surface and heat-absorbers, wherein the temperature of the heat absorber is up to 20° C. lower than the temperature of the substrate and solution-melt, prior to the step of arranging contact between the substrate working surface and the solution melt.

3. The method of claim 1 wherein the solution-melt comprises a concentration of material from which crystals will form, wherein the step of arranging contact between the substrate working surface and the solution-melt comprises joining one or more materials comprising one or more bulk lattice constants and creates a system comprising a wetting angle on the boundary of the solution-melt and substrate materials, wherein the bulk lattice constants differ by more than 0.5% or the wetting angle is more than 50°, and the concentration of the material from which crystals will form is 0.1 atom % or less, whereby the epitaxial growth comprises one or more islands comprising three dimensions, wherein each of said dimensions measures 1 µm or less.

4. The method of claim 1 wherein said solution-melt comprises a concentration of material from which crystals will form, the step of arranging contact between the substrate working surface and the solution-melt comprises joining one or more materials comprising one or more bulk lattice constants and creates a system comprising a wetting angle of joined materials wherein the bulk lattice constants differ by less than 0.5%, the wetting angle is less than 40°, wherein the concentration of material from which crystals will form is 0.1 atom % or less, and whereby the epitaxial growth forms a layer comprising a thickness of 1 µm or less.

5. A modification of a Liquid Phase Epitaxy method comprising the steps of:
   providing a substrate, a solution-melt, and a heat-absorber, wherein the substrate comprises a working surface and a back surface, the solution-melt comprises a saturation temperature, and the heat absorber comprises a temperature;
   heating the solution-melt and the substrate to the saturation temperature;
   arranging contact between the substrate working surface and the solution-melt;
   arranging contact between the substrate back surface and the heat-absorber, wherein the temperature of the heat absorber is up to 15° C. lower than the temperature of the substrate and solution-melt, and wherein said contact creates a pulse cooling;
   carrying out epitaxial growth on the substrate working surface; and
   repeating the foregoing steps.

6. A method of epitaxial growth of a three dimensional matrix of nano-dimensional islands comprising one or more embedded layers of two dimensional nano-dimensional islands comprising the steps of:
   providing a substrate, a solution-melt, and a heat-absorber, wherein the substrate comprises a working surface and a back surface, the solution-melt comprises a saturation temperature, and the heat absorber comprises a temperature;
   heating the solution-melt and the substrate to the saturation temperature;
   arranging contact between the substrate working surface and the solution-melt;
   arranging contact between the substrate back surface and the heat-absorber, wherein the temperature of the heat absorber is up to 15° C. lower than the temperature of the substrate and solution-melt, said contact thereby creating a pulse cooling,
   carrying out epitaxial growth on the substrate working surface; and
   terminating the contact between the substrate working surface and the solution-melt, wherein the foregoing steps may be repeated.

* * * * *